(12) United States Patent
Groetzinger et al.

(10) Patent No.: US 11,112,003 B2
(45) Date of Patent: Sep. 7, 2021

(54) DEVICE AND METHOD FOR SENSING THE POSITION OF A SHIFT FORK OF A TRANSMISSION

(71) Applicant: WABCO GmbH, Hannover (DE)

(72) Inventors: Stefan Groetzinger, Gehrden (DE); Michael John, Lehrte (DE); Dirk Müntefering, Wedemark (DE); Romain Poux, Hannover (DE)

(73) Assignee: WABCO GmbH, Hannover (DE)

( * ) Notice: Subject to any disclaimer, the term of this patent is extended or adjusted under 35 U.S.C. 154(b) by 154 days.

(21) Appl. No.: 16/486,941

(22) PCT Filed: Mar. 20, 2018

(86) PCT No.: PCT/EP2018/056960
§ 371 (c)(1),
(2) Date: Aug. 19, 2019

(87) PCT Pub. No.: WO2018/172323
PCT Pub. Date: Sep. 27, 2018

(65) Prior Publication Data
US 2020/0248794 A1     Aug. 6, 2020

(30) Foreign Application Priority Data

Mar. 24, 2017   (DE) .................. 102017002873.7

(51) Int. Cl.
*F16H 59/10*       (2006.01)
*F16H 63/32*       (2006.01)
(Continued)

(52) U.S. Cl.
CPC ........... *F16H 59/105* (2013.01); *F16H 63/32* (2013.01); *G01R 33/072* (2013.01); *F16H 2063/3079* (2013.01)

(58) Field of Classification Search
CPC ... F16H 1/00; F16H 7/00; F16H 27/00; G01R 1/00; G01B 1/00; G01B 2210/00
See application file for complete search history.

(56) References Cited

U.S. PATENT DOCUMENTS 8,131,501 B2    3/2012    Bosch et al.
8,760,152 B2    6/2014    Uhlenbruck
(Continued)

FOREIGN PATENT DOCUMENTS

DE          101 50 955 C1     6/2003
DE     10 2006 011207 A1      9/2007
(Continued)

OTHER PUBLICATIONS

German Search Report from corresponding German application No. 10 2017 002 873.7 dated May 29, 2018 (6 pages).
(Continued)

*Primary Examiner* — Jermele M Hollington
*Assistant Examiner* — Temilade S Rhodes-Vivour
(74) *Attorney, Agent, or Firm* — Dickinson Wright PLLC

(57) ABSTRACT

In a device for sensing the position of a shift fork in a transmission, the shift fork is connected to a piston rod of a shifting piston which is guided axially in a shifting cylinder. The shift fork engages an axially slidable sliding sleeve, which slides on a transmission shaft, to engage or disengage a transmission stage. A magnet functioning as a signal generator is arranged on an actuating element, such as the switching piston, piston rod or shift fork. A 3D Hall sensor positionally fixed relative to the magnet functions as a signal receiver, sensing a magnetic field generated by the magnet. An electronic control unit connected to the 3D hall sensor determines the position of the shift fork from the relative positions of the magnet and 3D Hall sensor and transmits the
(Continued)

position as a signal, taking into account linear, rotational, and/or pivoting movements of the actuating element.

10 Claims, 2 Drawing Sheets

(51) Int. Cl.
*G01R 33/07* (2006.01)
*F16H 63/30* (2006.01)

(56) References Cited

U.S. PATENT DOCUMENTS

| | | | |
|---|---|---|---|
| 2007/0216402 A1 | 9/2007 | Blessing et al. | |
| 2013/0002242 A1* | 1/2013 | Tsukamoto | H02P 1/00 |
| | | | 324/207.12 |
| 2013/0008156 A1* | 1/2013 | Heubner | F16H 63/3483 |
| | | | 60/476 |
| 2013/0141082 A1* | 6/2013 | Zhou | G01D 5/2033 |
| | | | 324/207.13 |
| 2015/0053027 A1* | 2/2015 | Downs | B60K 17/344 |
| | | | 74/15.4 |
| 2015/0068341 A1* | 3/2015 | Andreasen | F16H 61/0403 |
| | | | 74/473.11 |
| 2015/0211587 A1* | 7/2015 | Kimes | F16D 48/064 |
| | | | 192/43.1 |

FOREIGN PATENT DOCUMENTS

| | | |
|---|---|---|
| DE | 10 2007 054 434 B3 | 2/2009 |
| DE | 10 2008 058 163 A1 | 5/2010 |
| DE | 10 2009 015 883 A1 | 10/2010 |
| DE | 10 2014 218 495 A1 | 11/2015 |
| EP | 1 438 755 A2 | 7/2004 |
| JP | 2013 029138 A | 2/2013 |
| WO | 03 036733 A2 | 5/2003 |
| WO | 2009/052976 A1 | 4/2009 |

OTHER PUBLICATIONS

International Search Report from corresponding PCT application No. PCT/EP2018/056960 dated Jun. 15, 2018 (3 pages).

* cited by examiner

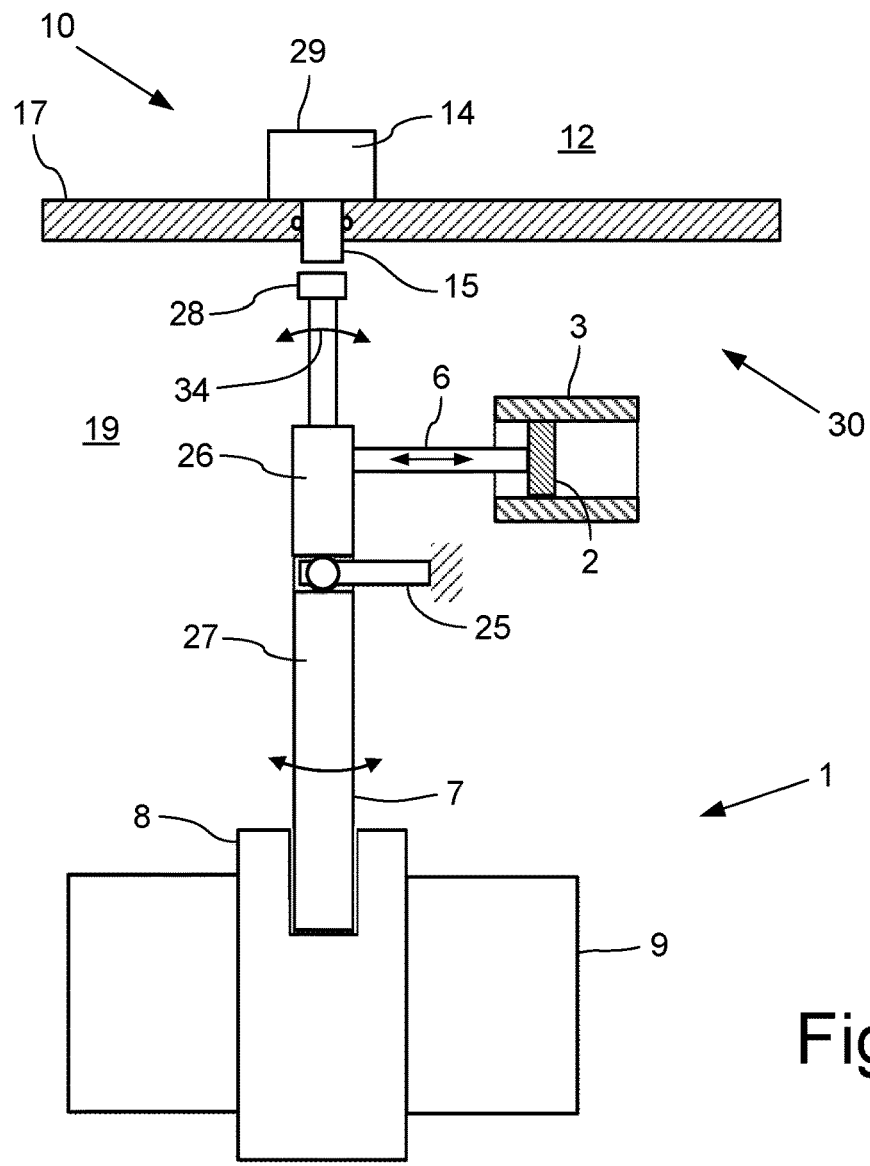
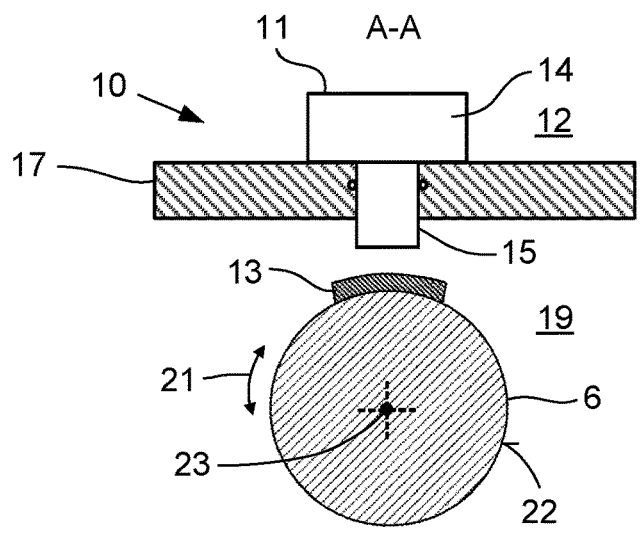
Fig.3
Fig.2

DEVICE AND METHOD FOR SENSING THE POSITION OF A SHIFT FORK OF A TRANSMISSION

TECHNICAL FIELD

The invention relates to a device having a Hall sensor apparatus for sensing the position of a shift fork in a transmission and to a method for sensing the position of a shift fork in a transmission having such a device.

BACKGROUND

The control of an automated transmission requires information about the respective current gear change status for changing between various transmission stages. For this purpose, generally, the position of a shift fork or of a sliding sleeve which is actuated by the shift fork is sensed. The sliding sleeve connects a gearwheel to a shaft in a rotationally fixed fashion in order to engage a transmission stage and releases the gearwheel in order to disengage the transmission stage. The position of the shift fork is made available to an electronic control unit of the transmission, which determines and transmits shift commands.

The measurement of a relevant axial position of an actuating element in this regard is usually carried out by sensing a linear movement of a shifting rail, push rod or the like with a sensor which measures in a purely linear fashion, such as an inductive measuring system or a simple Hall sensor. If the shift fork movement or position is to be measured directly, it is possible with conventional sensors only when shift forks move linearly. Linear sensors are not very suitable for transmission designs in which a shift fork carries out a pivoting movement in order to engage or disengage a transmission stage, since the signal generator cannot be provided directly on the shift fork, but rather only on an actuating element, for example a piston rod or a shifting piston, which is moved linearly and interacts with the latter.

Indirect sensing of the position of a pivoted shift fork with a linear sensor is therefore possible per se, but measurement of the position with a signal generator provided on an actuating element operatively connected to a shift fork, and which has the purpose of activating the shift fork, can give rise to problems when made with a purely linear measuring method. Even a small amount of free play between the actuating element and the shift fork, which may be allowed by the design, or result from fabrication or wear, can give rise to measuring errors. Such play can occur, for example, between a moving shifting piston or piston rod carrying the signal generator and a fixed shifting cylinder in which the shifting piston is guided. This play is particularly relevant when the signal generator rotates with respect to the signal receiver, for example during a rotational movement of a piston rod bearing the signal generator about its longitudinal axis that activates the shift fork. This play can give rise to an axial offset of the sensor signal with respect to the actual shift fork position, or to signal noise, or even to the complete failure of the measuring signal.

The use of linear sensors in multiple dimensions, such as inductive measuring systems or integrated spatial sensors such as 3D Hall sensors, for sensing the position of components in a variety of vehicle systems is already known. EP 1 438 755 B1 discloses the arrangement and method of use for such a 3D Hall sensor for the spatial sensing of magnetic fields. DE 10 2009 015 883 A1 describes a 3D Hall sensor device for sensing the position of a drive position selector lever with a signal generator arranged on the drive position selector lever and a signal receiver spaced apart from the signal generator.

DE 10 2014 218 495 A1 discloses a sensor apparatus for sensing the shift state of a shifting shaft in a transmission, wherein a magnet is arranged on the shifting shaft as a signal generator, and a Hall sensor is attached in a fixed fashion as a signal receiver. When there is a change in the axial position of the signal generator, a change occurs in the relative position between the signal generator and the Hall sensor. The signal generator is disclosed as an annular segment or as a ring.

DE 10 2008 058 163 A1 discloses a device for sensing all the shift positions in a transmission, such as the neutral position, reverse gear and intermediate positions. The device has a movable actuating element, such as a shaft for transmitting shifting movements, which is assigned at least one signal generator magnet. At least two Hall elements, such as two 3D Hall sensors, are provided for determining the position of the actuating element.

SUMMARY OF THE INVENTION

Against this background, the invention is based on the object of proposing a device for sensing the position of a shift fork in a transmission, which is improved in terms of measuring accuracy and reliability and reduces manufacturing costs of the transmission. A further object of the invention is a method for sensing the position of a shift fork in a transmission with such a device. In particular, such a device needs to be suitable for an automatic transmission in the drive train of a vehicle.

The invention is based on the realization that a conventional position sensor, which can measure only linear movements, cannot be used directly on shift forks which have to be pivoted in order to activate a sliding sleeve in a transmission. Furthermore, such a conventional position sensor is suitable only to a limited degree for such actuating elements given that they generally have other undesirable degrees of freedom of movement.

On the other hand, a 3D Hall sensor permits both the measurement of linear movements and the sensing of curved and/or rotational movements of a signal generator attached to an actuating element, relative to the sensor. Such a sensor can be used on actuating elements which carry out three-dimensional movements, since the magnetic field of a signal generator attached to the respective actuating element follows its movement and can be resolved spatially by the 3D Hall sensor in terms of distance and angle. This permits the respective axial position of a sliding sleeve, which is activated by the actuating element during a shifting process, to be determined accurately even if the specified actuator system suffers wear. The Hall sensor technology does not require the target or the magnetic field to move during the measurement. In other words, the determination of position can be requested at any time, even when the actuating element is stationary. The flexibility provided by the various possible arrangements of such a sensor system permits the necessary electrical cabling of the Hall sensor to be exported from a wet region of the transmission into a dry region adjacent thereto.

The invention is therefore based on a device with a Hall sensor apparatus for sensing the position of a shift fork in a transmission, wherein the shift fork is operatively connected to a piston rod of a shifting piston. The shifting piston is guided in an axially movable fashion in a shifting cylinder, and the shift fork engages in a sliding sleeve arranged in an axially slidable fashion on a transmission shaft. The sliding movement of this sliding sleeve in turn engages or disengages a transmission stage of the transmission.

In order to produce a device for sensing the position of a shift fork in a transmission, the invention provides a magnet as a signal generator arranged on at least one of the adjustable actuating elements of the switching piston, piston rod or shift fork. A 3D Hall sensor arranged in a positionally fixed fashion, relative to the magnet, is provided as a signal receiver for spatially sensing the magnetic field generated by the magnet. The 3D Hall sensor is connected to an electronic control unit, which determines the current position of the shift fork based on the relative positions of the magnet and the 3D Hall sensor. The electronic control unit transmits the position as a signal that takes into account the linear movements, rotational movements and/or pivoting movements of the respective actuating element.

The application of the 3D Hall sensor technology in a transmission permits very flexible arrangement of a signal generator in the transmission, irrespective of whether an actuating element to be measured is shifted or pivoted axially. The signal generator can therefore be provided directly on the respective actuating element, which is remote from the actuator. As a result, improved measuring accuracy is obtained as measurement errors cannot arise from mechanical changes or wear in the transmission. In particular, curved movements of an actuating element can be sensed. Simple linear measurements are, of course, also possible.

The invention is also advantageously suitable for arrangements in which the signal generator cannot be provided, or is not to be provided, directly on the actuating element to be measured, as in the case of design or installation space constraints, for example. The invention mitigates possible impairment of the measurement signal stemming from superimposed linear and nonlinear movements of the actuating element, or between a plurality of actuating elements involved in the actuating function, as described in the embodiments disclosed below. As a result, reliable and precise sensing of the position of a shift fork is ensured. In particular, by using a 3D Hall sensor it is possible to reliably and accurately detect whether a desired shift position of the transmission is reached even if there are disruptive influences on the actuating element with the disposed signal generator during the actuating movement to be measured.

3D Hall sensors are commercially available as compact semiconductor components in various designs. Since only a single 3D Hall sensor is required as a signal receiver for the sensing of a position, installation space requirements are reduced, in comparison with conventional arrangements requiring a plurality of sensors for spatial magnetic field measurements. The 3D Hall sensor can be configured for the largest possible distance from a signal generator in the transmission. As a result, the sensor is suitable for various mounting positions and there is no need for any costly adaptations to the installation location within the transmission. As a result, fabrication and development costs can be reduced.

According to a first embodiment of the invention, a signal generator magnet is arranged on the piston rod or on the shifting piston such that a linear movement of the piston rod or of the shifting piston can be sensed in conjunction with an assigned 3D Hall sensor so that a bearing-dependent and/or wear conditioned rotational movement of the piston rod or of the shifting piston about its longitudinal axis, superimposed on the linear movement of the piston rod or of the shifting piston, can be compensated during the sensing of the magnetic field by dimensioning of the magnet, which is adapted to a maximum possible rotational angle with respect to the 3D Hall sensor, or so that such a disruptive movement can be eliminated computationally during the determination of the position of the shift fork in the control device.

Accordingly, the signal generator can be provided on the piston rod or on the shifting piston of an actuator, actuated by a transmission controller that activates the shift fork electropneumatically, for example. The piston rod moves linearly to apply an actuating force to the shift fork. In this embodiment, the actuating position in the transmission is not sensed directly at the shift fork, but rather at the shifting piston or at the piston rod. The signal generator is, therefore, not attached to the shift fork but rather to the shifting piston or to the piston rod.

However, the bearing of the shifting piston quite often generates a certain rotation of the shifting piston about its longitudinal axis, making the measurement of the axial actuating position more difficult or even impossible. In addition, considerable rotation of the shifting piston can result from fabrication tolerances or transmission wear. As a result, the angular position between the signal generator and the positionally-fixed signal receiver varies. This angular variance can result in strong signal noise, or even loss of the measuring signal when a linear sensor is used. However, the 3D Hall sensor can compensate for the rotation of the shifting piston by sensing the spatial angle of the magnet attached to the shifting piston.

This compensation is possible given that the signal generator, that is to say the magnet, can be configured to possess a magnetic field of sufficient strength, such that the signal receiver can detect the magnet even if the shifting piston or the piston rod is rotated, thereby generating a sufficiently strong and accurate measurement signal. As a result, loss or weakening of the signal resulting from the bearing tolerance of the shifting piston or of the shifting rod can be prevented. The dimensioning of the magnet thereby improves the accuracy of the measurement of the position of the shift fork.

An additional measurement consist in defining a parameter that correlates the rotational angle of the shifting piston or of the piston rod with a measuring signal is to be expected. A correction factor can then be calculated from the correlation, and used to correct the shift fork position calculation. The calculation of the correction factor can take place in the 3D Hall sensor itself or in an electronic control unit connected to the sensor. As a result, the measurement signal is computationally independent from the rotation of the shifting piston or of the piston rod, thereby improving the accuracy of the measurement of the position of the shift fork.

Furthermore, in some embodiments the magnet is attached to the lateral face of the piston rod or is securely seated in a pocket-shaped recess in the piston rod. Accordingly, the magnet can easily be fitted and attached to the piston rod or the shifting piston. In some embodiments, the magnet is directly integrated into the shifting piston or into the piston rod so that its surface forms part of the lateral face thereof. The magnet can be fitted as an annular segment into a corresponding recess in the piston rod, for example. As a result, the magnet does not occupy any additional installation space. In addition, integration of the magnet reduces the amount of required material and the mass of the shifting piston or piston rod. Furthermore, integration of the magnet prevents the application of undesired torque to the components.

According to a second embodiment of the invention, a pivoting movement of the shift fork engages or disengages a transmission stage of the transmission, and a magnet arranged on the shift fork, in conjunction with an assigned 3D Hall sensor, determines the position of the shift fork resulting from the pivoting movement.

In this embodiment, the signal generator is directly attached to a shift fork which is pivoted to activate a sliding sleeve. The signal generator can alternatively be integrated into the shift fork. The 3D Hall sensor senses the magnetic field of the magnet during the pivoting movement of the shift fork, thereby determining the position of the shift fork and therefore of the sliding sleeve, to determine the current shift state of the transmission. The current shift state is made available to the transmission controller.

Direct attachment of the magnet to the shift fork can also be used to detect a broken shift fork or a broken connection between the shift fork and the piston rod, as in this case, the shift fork does not move following activation of the shifting piston. This condition can then be signaled by a fault message. The transmission can subsequently be protected against damage and, if appropriate, suitable measures can be initiated. Thus, the operational reliability of a transmission equipped with the device disclosed herein is improved.

In some embodiments, a linear movement of the shift fork engages or disengages a transmission stage of the transmission, and a magnet arranged on the shift fork, in conjunction with an assigned 3D Hall sensor, determines the position of the shift fork resulting from the linear movement. A non-linear movement of the shift fork, super imposed on the linear movement, can be compensated for during the sensing of the magnetic field by suitable dimensioning of the magnet. Thus, the disruptive non-linear movement can be eliminated computationally during the determination of the position of the shift fork.

The disclosed device can therefore be advantageously used in two common designs of sliding-sleeve-activated transmission designs, specifically those that use a pivoting shift fork or a sliding shift fork. The device can directly make a position measurement at the shift fork, or can measure the position of the shift fork indirectly via the position measurement of an actuating element that activates the shift fork, regardless of the actuation path of the shift fork. Destructive interference that adversely affects the measurement can be filtered out by the 3D Hall measuring technology in the electronic control device or in the electronics of the 3D Hall sensor.

In a further embodiment, the 3D Hall sensor is arranged at least partially outside an oil space of the transmission. In this embodiment, the 3D Hall sensor has a sensor head with an electrical interface and a sensor finger which is connected to the sensor head. The sensor finger projects through a housing wall into the oil space of the transmission, in the direction of the assigned magnet, and the sensor head is arranged on an outer side of the housing wall and is attached in an oil-tight fashion with respect to the oil space.

The disclosed 3D Hall sensor apparatus for measuring the position of the shift fork permits flexibility in the positioning of a signal receiver and associated signal generator within a transmission. For example, the signal receiver can be removed from the wet region of the transmission so that at least the electrical connection of the signal receiver is located in a dry region. The sensor finger can project into the oil region to measure the position of the signal generator. As a result, the electrical lines connected to the sensor are not run through the wet region of the transmission, where there is generally little available installation space. The electrical sensor contact is therefore significantly less costly and less susceptible to cable damage than with conventional technical solutions.

In an additional embodiment of the invention, the 3D Hall sensor is arranged completely outside the oil space of the transmission. Ideally, it is possible to scan the position of a signal generator through a housing wall composed of non-magnetic material, such as aluminum. For example, in the case of transmission structures in which the distance between the signal generator and the signal receiver can be made relatively small and the wall thickness of the housing comparatively thin, a signal generator of sufficient strength may be provided such that the signal receiver can be mounted entirely in the dry region. As a result, electrical cables need not be run through the transmission housing and there is no need for drilled holes and seals in the walls of the transmission housing to accommodate the sensor. Therefore, the cost of implementing the 3D Hall sensor apparatus for sensing the position of a shift fork or sliding sleeve can be reduced even further.

In another aspect, the invention relates to a method for determining the position of a shift fork in a transmission via a Hall sensor apparatus, wherein the shift fork is operatively connected to a piston rod of a shifting piston which moves axially in a shifting cylinder. The shift fork engages in a sliding sleeve which can slide axially on a transmission shaft to engage or disengage a transmission stage of the transmission. A magnet attached to the shifting piston, the piston rod or the shift fork is sensed spatially by a positionally fixed 3D Hall sensor. A linear and/or rotational actuating movement of the shifting piston or piston rod, and/or when there is a pivoting movement of the shift fork, moves the magnet, changing its relative position with respect to the positionally fixed 3D Hall sensor. The position of the shift fork is then determined from the sensor signal of the 3D Hall sensor detecting the signal generator magnet.

Finally, the invention also relates to an actuator for an automatic transmission of a motor vehicle, wherein the actuator has a device for sensing the position of a shift fork within the transmission that is actuated directly or indirectly by the actuator. The actuator has the features of at least one of the devices described above, and can be operated to perform the method disclosed above. The actuator allows the method to be carried out at each shifting operation, and at each of the shift forks actively involved in the respective shifting process, thereby ensuring satisfactory shifting control of the transmission.

BRIEF DESCRIPTION OF THE DRAWINGS

The invention will be explained in more detail below with reference to various embodiments illustrated in the appended drawing. In the drawings, FIG. 2 shows the Hall sensor apparatus according to FIG. 1 in a schematically simplified and enlarged cross section, and FIG. 3 shows a schematic illustration of a second embodiment of a Hall sensor apparatus according to the invention.

Figure 1:
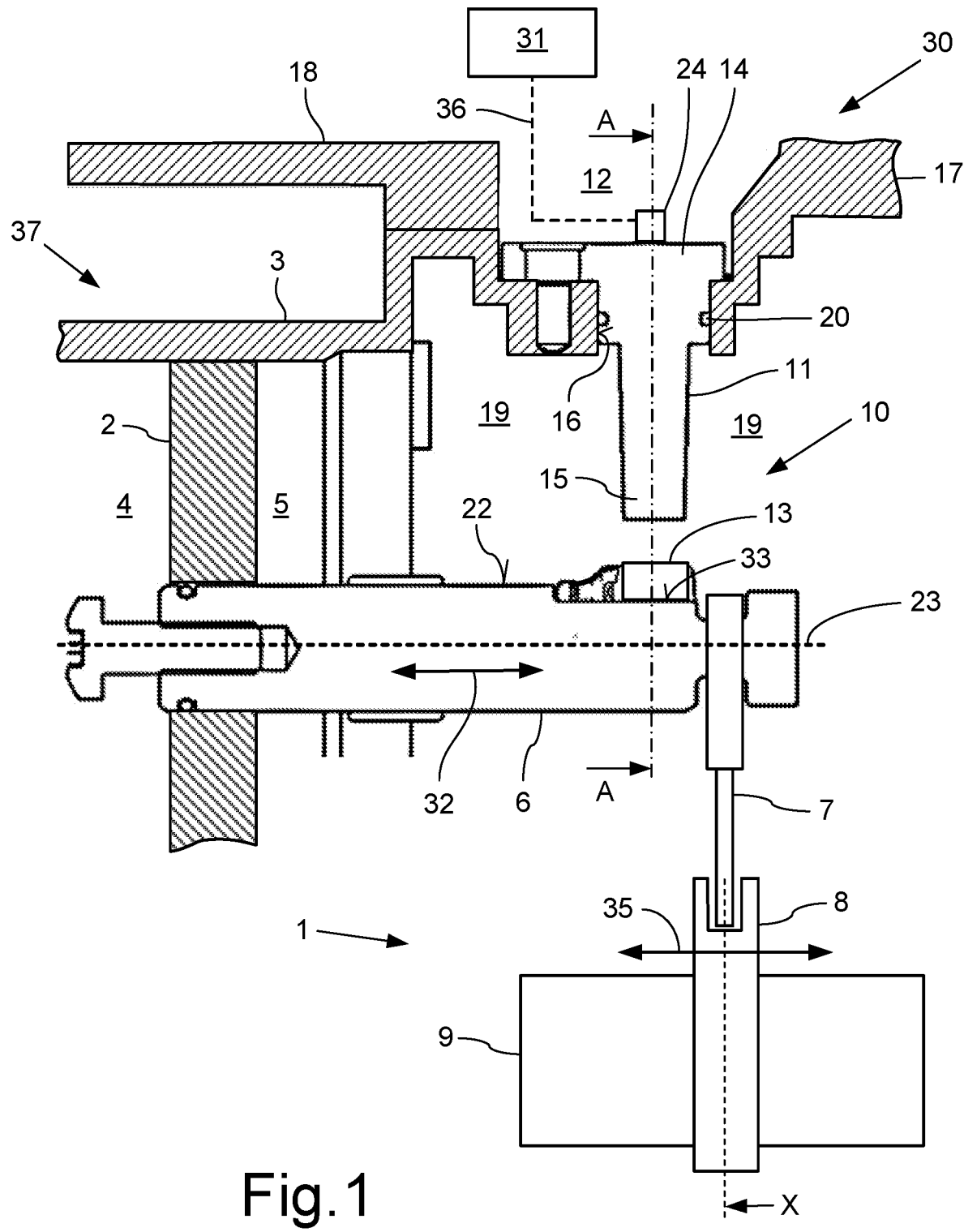
FIG. 1 shows a schematic detail of a transmission and of a shifting actuator with a Hall sensor apparatus according to a first embodiment of the invention.

The drawings are provided herewith for purely illustrative purposes and are not intended to limit the scope of the present invention.

DETAILED DESCRIPTION OF THE DRAWINGS

A number of components in the figures correspond in their design and/or function, and are therefore denoted by the same reference symbols for the sake of simplicity.

FIG. 1 shows a schematic detail of an automatic transmission 1 with a transmission shaft 9 on which a sliding sleeve 8 is arranged in an axially movable fashion. The sliding sleeve 8 is connected to a shift fork 7 which can be activated by a shifting actuator 37. The shifting actuator 37 has a shifting piston 2 which is guided in an axially slidable fashion in a shifting cylinder 3. The shifting piston 2 separates a first pressure space 4 and a second pressure space 5 from one another. The two pressure spaces 4, 5 can be filled with a pressure medium or can be emptied thereof, so that the shifting piston 2 can be activated alternately, for example pneumatically. The piston rod 6 is attached to the shifting piston 2. The possible linear movement directions 32 of the shifting piston 2 and of the piston rod 6 coaxially with respect to the longitudinal axis 23 thereof are indicated by a double arrow.

The shifting fork 7 is connected by one of its ends to the piston rod 6 and engages with its other end in an annular groove of the sliding sleeve 8. Therefore, the shifting piston 2, the piston rod 6, the shift fork 7 and the sliding sleeve 8 are coupled to one another in terms of movement. When pressure is applied to one of the two pressure spaces 4, 5, the sliding sleeve 8 is adjusted in one of the two axial directions by the axial movement of the shifting piston 2 via the shift fork 7. In a way which is not illustrated here but is known per se, when a gear of the transmission is shifted the sliding sleeve 8 is slid by means of the shift fork 7 over a toothed shifting arrangement of a gearwheel. The gearwheel is connected in a rotationally fixed fashion to the transmission shaft 9. The engaged gear is subsequently disengaged by a shifting movement in the opposite direction. The linear shifting movement 35 of the sliding sleeve 9 is indicated by a double arrow.

The transmission 1 or the shifting actuator 37 has a device 30 with a Hall sensor apparatus 10 for sensing the respective current position X of the shift fork 7. The position X of the shift fork 7 is unambiguously linked to the axial position of the sliding sleeve 8 and therefore to the current shift state of the transmission 1. The Hall sensor apparatus 10 has a 3D Hall sensor 11 and a magnet 13 which is assigned thereto, wherein the magnet 13 functions as a signal generator, and the 3D Hall sensor 11 as a signal receiver. The magnet 13 is arranged on the radial lateral face 22 of the piston rod 6 adjacent to the engagement region of the shift fork 7 and is attached there in a recess 33.

The 3D Hall sensor 11 is composed of a sensor head 14 and a sensor finger 15 which forms a component together with the sensor head 14. The 3D Hall sensor 11 is inserted into a drilled hole 16 in a housing wall 17 of a transmission housing 18, wherein the sensor finger 15 projects into a wet region which is formed as an oil space 19 within the transmission housing 18 and points with its free end in the direction of the magnet 13. The sensor head 14 has an electrical interface 24 which is located in a dry region 12 outside the oil space 19. Connected to this electrical interface 24 is a sensor line 36 which is connected to a control device 31. This control device 31 controls, inter alia, switching valves (not illustrated here) using the information supplied by the 3D Hall sensor 11, which switching valves permit alternately an inflow of pressure medium into the two pressure spaces 4, 5 or empty them of the pressure medium. In addition, it is apparent that the 3D Hall sensor 11 is sealed in an oil-tight fashion with respect to the housing wall 17 by means of a seal 20 which is embodied as a sealing ring.

As is apparent in more detail from FIG. 2, the magnet 13 fits snugly against the lateral face 22 of the piston rod 6 in a positively locking fashion. The width of the magnet 13 in the longitudinal axial direction of the piston rod 6 is adapted to the opposing width of the sensor finger 15 (FIG. 1). The length of the magnet 13 in the circumferential direction of the piston rod 6 is, on the other hand, adapted to a rotational angle 21, indicated by the double arrow, of the piston rod 6 about the longitudinal axis 23 thereof (FIG. 2). As a result, the magnetic field of the magnet 13 is sufficiently dimensioned, in size, shape, and magnetic strength, in order to be sensed by the 3D Hall sensor 11, even in the case of an undesired rotation of the piston rod 6 through a rotational angle 21.

In order to determine the position X of the shift fork 7, the 3D Hall sensor 11 senses the magnetic field of the magnet 13. The Hall voltage, which can be tapped at the 3D Hall sensor 11, is unambiguously correlated with the relative position between the sensor finger 15 and the magnetic field, or between the sensor finger 15 and the magnetic field 13. The undesirable rotation of the piston rod 6 to a certain extent during an axial movement thereof can be compensated for during a vector measurement and evaluated via the magnetic field in the 3D Hall sensor 11 or in the control device 31, such that the accuracy of the determined position of the shift fork 7 is not negatively impacted by the superimposed rotational movement, and the measured signal is not attenuated in its amplitude level.

FIG. 3 shows a further embodiment. The piston rod 6 is connected here in an articulated fashion to the shift fork 7. The piston rod 6 presses or pulls, above a pivoting bearing 25, onto an upper part 26 of the shift fork 7, which results in the pivoting of the shift fork 7. A magnet 28 is attached directly to the free end, remote from the shifting sleeve of the shift fork 7, directly adjacent to a 3D Hall sensor 29. The shift fork 7 engages with its lower part 27 in a groove of the sliding sleeve 8 and slides the sleeve axially during the described pivoting movement. The 3D Hall sensor 29 can measure the rotatory movement of the shift fork 7 via the relative position, or change in position, of the magnetic field, with respect to the 3D Hall sensor 29, converting it into an axial position of the shift fork 7 or sliding sleeve 8. If electronics in the sensor are not directly capable of calculating the position of the shift fork, the calculation can be carried out in the above-mentioned control device 31.

While the above description constitutes the preferred embodiments of the present invention, it will be appreciated that the invention is susceptible to modification, variation and change without departing from the proper scope and fair meaning of the accompanying claims.

The invention claimed is:

1. A device (30) having a Hall sensor apparatus (10) for sensing a position of a shift fork (7) in a transmission (1), comprising:

the shift fork (7) operatively connected to a piston rod (6) of a shifting piston (2) that moves axially in a shifting cylinder (3); a sliding sleeve (8) engaged with the shift fork, which is arranged in an axially slidable fashion on a transmission shaft (9), wherein a sliding of the sliding sleeve (8) engages or disengages a transmission stage of the transmission (1);

a magnet (13, 28) operating as a signal generator and arranged on an adjustable actuating element selected from the group consisting of: the shifting piston (2), the piston rod (6), and the shift fork (7);

a single 3D Hall sensor (11, 29) operating as a signal receiver arranged in a positionally fixed fashion relative to the magnet (13, 28), wherein the 3D Hall sensor operates as a signal receiver operable to spatially sense a magnetic field generated by the magnet (13, 28); and an electronic control unit (31) connected to the 3D Hall sensor, wherein the electronic control unit (31) is operable to determine a current position of the shift fork (7) from a position of the magnet (13, 28) relative to a position of the single 3D Hall sensor (11, 29), and converts the position of the shift fork to a signal, under consideration of at least two of the following three movements of the adjustable actuating element (2, 6, 7): a linear movement, a rotational movement, and a pivoting movement of the adjustable actuating element (2, 6, 7).

2. The device as claimed in 1, wherein the magnet (13) is arranged on the piston rod (6) or on the shifting piston (2) in such a way that the linear movement (32) of the piston rod (6) or of the shifting piston (2) is detectable by the single 3D Hall sensor (11), wherein the magnet is dimensioned to compensate for the rotational movement superimposed on the linear movement (32) of the piston rod (6) or of the shifting piston (2) about a longitudinal axis (23) while the 3D Hall sensor senses the magnetic field by dimensioning of the magnet (13), wherein the magnet has a maximum possible angle of rotation (21) with respect to the single 3D Hall sensor (11), or by computationally eliminating a disruptive movement during a determination of the position of the shift fork (7) in the electronic control device (31).

3. The device as claimed in claim 2, wherein a first magnet (13) is attached to a lateral face (22) of the piston rod (6) or is securely seated in a pocket-shaped recess (33) in the piston rod (6).

4. The device as claimed in claim 1, wherein a pivoting movement (34) of the shift fork (7) engages or disengages a transmission stage of the transmission (1), and the magnet (28) is arranged on the shift fork (7), wherein the position of the shift fork (7) resulting from the pivoting movement (34) of the shift fork (7) is determined in conjunction with the single 3D Hall sensor (29).

5. The device as claimed in claim 1, wherein a linear movement (35) of the shift fork (7) engages or disengages a transmission stage of the transmission (1), and the magnet is arranged on the shift fork (7), wherein a position of the shift fork (7) resulting from the linear movement of the shift fork (7) is determined in conjunction with the single 3D Hall sensor (11) and a nonlinear movement of the shift fork (7) superimposed on the linear movement is corrected for during a sensing of the magnetic field by a suitable dimensioning of the magnet, or by computationally eliminating the nonlinear movement during a determination of the position of the shift fork (7) in the electronic control device.

6. The device as claimed in claim 1, wherein the single 3D Hall sensor (11, 29) is arranged at least partially outside of an oil space (19) of the transmission (1).

7. The device as claimed in claim 1, wherein the single 3D Hall sensor (11, 29) is arranged completely outside an oil space (19) of the transmission (1).

8. An actuator (37) for an automatic transmission (1) of a motor vehicle, comprising the device (30) for sensing the position of a shift fork (7) as claimed in claim 1, wherein the shift fork is operable to be actuated directly or indirectly by the actuator (37).

9. A device (30) having a Hall sensor apparatus (10) for sensing a position of a shift fork (7) in a transmission (1), comprising:

the shift fork (7) operatively connected to a piston rod (6) of a shifting piston (2) that moves axially in a shifting cylinder (3); a sliding sleeve (8) engaged with the shift fork, which is arranged in an axially slidable fashion on a transmission shaft (9), wherein a sliding of the sliding sleeve (8) engages or disengages a transmission stage of the transmission (1);

a magnet (13, 28) operating as a signal generator and arranged on an adjustable actuating element selected from the group consisting of: the shifting piston (2), the piston rod (6), and the shift fork (7);

a 3D Hall sensor (11, 29) operating as a signal receiver arranged in a positionally fixed fashion relative to the magnet (13, 28), wherein the 3D Hall sensor operates as a signal receiver operable to spatially sense a magnetic field generated by the magnet (13, 28); and an electronic control unit (31) connected to the 3D Hall sensor, wherein the electronic control unit (31) is operable to determine a current position of the shift fork (7) from a position of the magnet (13, 28) relative to a position of the 3D Hall sensor (11, 29), and converts the position of the shift fork to a signal, under consideration of a linear movement, a rotational movement, or a pivoting movement of the adjustable actuating element (2, 6, 7), wherein the 3D Hall sensor (11, 29) has a sensor head (14) with an electrical interface (24) and a sensor finger (15) connected to the sensor head (14), wherein the sensor finger (15) projects through a housing wall (17) of the transmission into the oil space (19) of the transmission (1) in the direction of an assigned magnet (13, 28), and the sensor head (14) is attached to an outer side of the housing wall (17) of the transmission in an oil-tight fashion with respect to the oil space (19).

10. A method for determining a position of a shift fork (7) in a transmission (1) with a Hall sensor apparatus (10), comprising the following steps:

attaching a magnet to a shifting piston, a piston rod, or a shift fork, wherein the shift fork (7) is operatively connected to the piston rod (6) of the shifting piston (2), the shifting piston is guided in an axially movable fashion in a shifting cylinder (3), and the shift fork (7) engages a sliding sleeve (8) which is axially slidable on a transmission shaft (9) to engage or disengage a transmission stage of the transmission (1), and spatially sensing a magnetic field of the magnet (13, 28) via a positionally fixed single 3D Hall sensor (11, 29), wherein at least two of the following three movements move the magnet therewith and change the position of the magnet with respect to the positionally fixed single 3D Hall sensor (11, 29), and a current position of the shift fork (7) is determined via a sensor signal of the single 3D Hall sensor (11, 29) based on the at least two of the following three movements: a linear actuating movement of the shifting piston or of the piston rod, a rotational actuating movement of the shifting piston (2) or of the piston rod (6), and a pivoting movement of the shift fork (7).

* * * * *